(12) United States Patent
Kang et al.

(10) Patent No.: US 7,488,633 B2
(45) Date of Patent: Feb. 10, 2009

(54) METHOD FOR FORMING POLYSILICON BY ILLUMINATING A LASER BEAM AT THE AMORPHOUS SILICON SUBSTRATE THROUGH A MASK

(75) Inventors: Myung-Koo Kang, Seoul (KR); Sook-Young Kang, Seoul (KR); Hyun-Jae Kim, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/016,430

(22) Filed: Jan. 18, 2008

(65) Prior Publication Data

US 2008/0166892 A1 Jul. 10, 2008

Related U.S. Application Data

(60) Division of application No. 10/854,664, filed on May 26, 2004, now Pat. No. 7,335,541, which is a continuation of application No. 10/135,066, filed on Apr. 29, 2002, now abandoned.

(30) Foreign Application Priority Data

Aug. 4, 2001 (KR) ............................. 2001-50421
Feb. 8, 2002 (KR) ............................. 2002-7365

(51) Int. Cl.
*H01L 21/00* (2006.01)

(52) U.S. Cl. .................. 438/166; 438/150; 438/198; 438/482; 438/486; 438/487; 257/E21.562

(58) Field of Classification Search ................. 438/150, 438/166, 198, 482, 486–487
See application file for complete search history.

(56) References Cited

U.S. PATENT DOCUMENTS

| 6,326,286 B1 | 12/2001 | Park et al. |
| 6,475,840 B1 | 11/2002 | Miyanaga et al. |
| 6,573,163 B2 | 6/2003 | Voutsas et al. |
| 2002/0104750 A1 | 8/2002 | Ito |

FOREIGN PATENT DOCUMENTS

| JP | 2000505241 | 4/2000 |
| JP | 2000-306859 | 11/2000 |
| JP | 2003022969 | 1/2003 |
| KR | 1999-023628 | 3/1999 |
| KR | 1020000001170 | 1/2000 |

*Primary Examiner*—Thanh Nguyen
(74) *Attorney, Agent, or Firm*—F. Chau & Associates, LLC

(57) ABSTRACT

A mask for crystallization of amorphous silicon to polysilicon is provided. The mask includes a plurality of slit patterns for defining regions to be illuminated. The plurality of slit patterns are formed along a longitudinal first direction and the mask moves along a longitudinal second direction. The first longitudinal direction is substantially perpendicular to the second longitudinal direction. Each of the split patterns is deviated apart by substantially a same distance from another. Thus, the polysilicon using the mask.

5 Claims, 9 Drawing Sheets

Horizontal illumination region

Vertical illumination region

Sequential lateral solidification process

METHOD FOR FORMING POLYSILICON BY ILLUMINATING A LASER BEAM AT THE AMORPHOUS SILICON SUBSTRATE THROUGH A MASK

CROSS-REFERENCE TO RELATED APPLICATIONS

This application is a Divisional of U.S. application Ser. No. 10/854,664 filed on May 26, 2004, now U.S. Pat. No. 7,335,541 which is a Continuation of U.S. application Ser. No. 10/135,066 filed on Apr. 29, 2002, now abandoned, which claims priority to Korean Patent Application No. 2002-7365, filed on Feb. 8, 2002 and Korean Patent Application No. 2001-50421, filed on Aug. 4, 2001, the disclosures of which are hereby incorporated herein by reference in their entireties.

BACKGROUND OF THE INVENTION (a) Field of the Invention

The present invention relates to a method of fabricating liquid crystal display, and more particularly, to a mask for forming polysilicon and a method for fabricating thin film transistor using the same.

(b) Description of the Related Art

Generally, a liquid crystal display has two substrates with electrodes, and a liquid crystal layer interposed between the two substrates. Each of the two substrates is sealed by a sealer while being spaced apart from each other by spacers. A voltage is applied to the electrodes so that the liquid crystal molecules in the liquid crystal layer are re-oriented to thereby control an amount of light transmission through the liquid crystal layer. Thin film transistors are provided at one of the substrates to control the signals transmitted to the electrodes.

Amorphous silicon is typically used to form a semiconductor layer in the thin film transistors. Generally, current mobility of the amorphous silicon-based thin film transistor is low, at about 0.5-1 $cm^2$/Vsec. This is inadequate for directly forming a driving circuit on a substrate. Thus, a polysilicon-based thin film transistor, which has a relatively high current mobility of about 20-150 $cm^2$/Vsec, has been developed to directly fabricate a driving circuit on the substrate.

Various methods for forming a polysilicon thin film have been proposed, including: directly depositing polysilicon layer onto a substrate at a relatively high temperature; depositing amorphous silicon layer onto a substrate and crystallizing the amorphous silicon layer at a temperature of about 600° C.; and depositing amorphous silicon onto a substrate and heat-treating the amorphous silicon layer using laser. However, as the polysilicon layer formed by using such high temperature has non-uniform crystalline particles, which deteriorate electrical characteristics of the thin film transistors, these methods are generally not applicable for substrates of liquid crystal display panels.

A sequential lateral crystallization process where the distribution of crystalline particles can be controlled in an artificial manner has been developed. In the sequential lateral crystallization process, polysilicon grains are grown perpendicular to the interface between a laser-illuminated liquid phase region and a non-illuminated solid phase region. The laser beam passes through a mask having a slit-shaped transparent portion, then, a slit-shaped liquid phase region is formed at an amorphous silicon layer. Thereafter, the liquid phase amorphous silicon is crystallized while being cooled. The growth of crystalline begins from the boundary of the solid phase region, and stops at the center of the liquid phase region. Such a process is repeated with moving the mask in the growing direction of the polysilicon grains so that the sequential lateral crystallization is performed throughout the entire target area.

In the case wherein the sequential lateral crystallization is performed while moving the mask only in the growing direction of the polysilicon grains, the size of the polysilicon grains in the moving direction of about several micrometers can be obtained. However, a size of the polysilicon grains in the perpendicular direction of the moving direction is about several thousand angstroms. Furthermore, the sizes of the polysilicon grains in a peripheral region of the mask and an edge of the slit are non-uniform. Consequently, polysilicon thin film transistors exhibit anisotropic characteristics. For example, current mobility of the thin film transistors is largely differentiated in two directions.

Thus, it is desirable to provide a method of fabricating a polysilicon layer and thin film transistors having isotropic current mobility.

SUMMARY OF THE INVENTION

A mask for crystallization of amorphous silicon into polysilicon is provided, which includes a plurality of slit patterns for defining regions to be-illuminated, wherein the plurality of slit patterns are formed along a longitudinal first direction and a mask moves along a longitudinal second direction and the first longitudinal direction being substantially perpendicular to the second longitudinal direction.

According to an embodiment of the present invention, each of the plurality of slit patterns is spaced apart by substantially a same distance from another. The mask includes a first region and a second region, the first region includes a first part of the plurality of slit patterns and the second region includes a second part of the plurality of slit patterns, the first part of the plurality of slit patterns is deviated from the second part of the plurality of slit patterns by one pitch, where the one pitch is a distance between the plurality of slit patterns.

According to an embodiment of the present invention, the mask includes a plurality of separate regions, each of the plurality of separate regions includes at least a portion of the plurality of slit patterns.

A mask for crystallization of amorphous silicon into polysilicon is also provided, which includes slit patterns for defining transmission regions of laser beams to be illuminated, wherein the slit patterns are arranged in first and second directions at two or more regions such that the polysilicon is grown in two or more directions. The first direction is substantially perpendicular to the second direction.

According to an embodiment of the present invention, the plurality of slit patterns are spaced apart with substantially the same distance. The mask includes a first region and a second region, the first region includes a first part of the plurality of slit-patterns and the second region includes a second part of the plurality of slit patterns, the first part of the plurality of slit patterns is perpendicular to the second part of the plurality of slit patterns. Each of the first region and the second region has at least two portions. The two portions of the first region include the first part of the plurality of slit patterns deviated each other by one pitch, wherein the one pitch is a distance between the slit patterns. The two portions of the second region include the second part of the plurality of slit patterns deviated each other by one pitch, where the one pitch is a distance between the slit patterns.

A method of a fabricating a thin film transistor is also provided. An amorphous silicon thin film is first formed on an insulating substrate. The amorphous silicon thin film is crystallized through a sequential lateral crystallization process to thereby form a semiconductor layer. The sequential lateral crystallization process is performed using a mask where slit patterns for defining transmission regions are arranged in first and second directions at two or more regions. The second direction is perpendicular to the first direction. A gate insulating layer is formed on the semiconductor layer such that the gate insulating layer covers the semiconductor layer. A gate electrode is formed on the gate insulating layer over the semiconductor layer. Impurities are implanted into the semiconductor layer to thereby form a source region and a drain region. An ohmic contract layer is formed such that the ohmic contact layer covers the gate electrode. The ohmic contact layer and the gate insulating layer are sequentially etched to thereby form contact holes exposing the source and the drain regions, respectively. Source and drain electrodes are formed such that the source and drain electrodes are connected to the source and the drain regions through the contact holes.

According to an embodiment of the present invention, the method further includes the step of forming a pixel electrode such that the pixel electrode is connected to the drain electrode. The gate insulating layer is preferably formed of silicon oxide or silicon nitride. The source and drain regions are preferably doped with n-type or p-type impurities. The pixel electrode is formed with transparent conductive material or reflective conductive material. The transparent conductive material includes ITO (indium tin oxide) or IZO (indium zinc oxide).

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein.

DETAILED DESCRIPTION OF PREFERRED EMBODIMENTS

Preferred embodiments of this invention will be explained with reference to the accompanying drawings.

Figure 1:
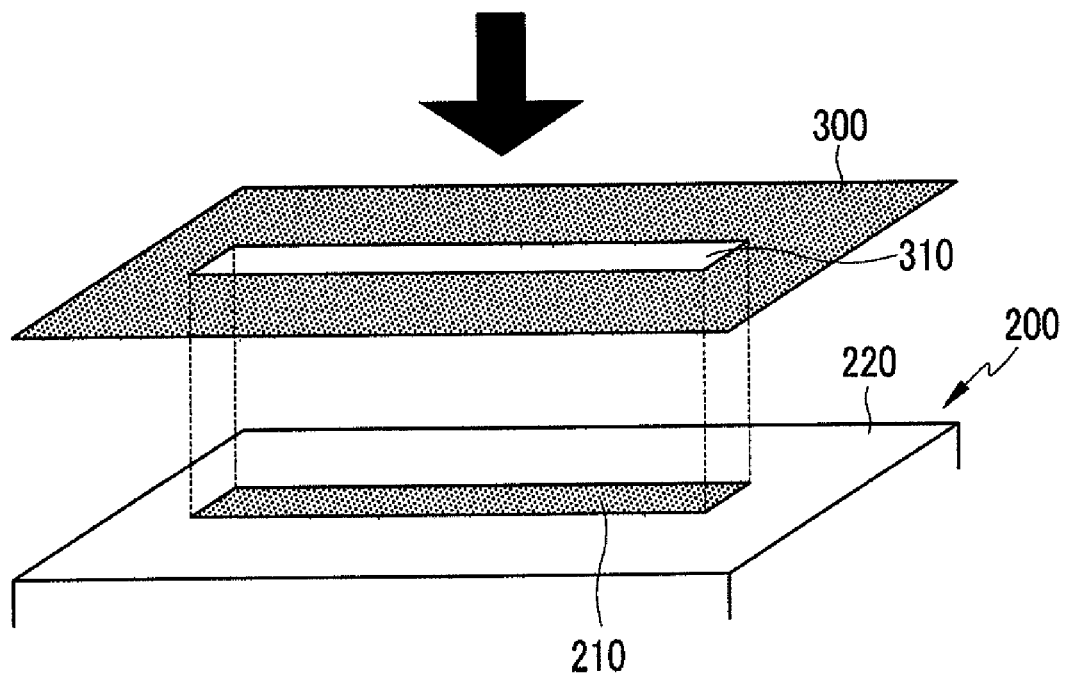
FIG. 1 illustrates a sequential lateral crystallization process where amorphous silicon is crystallized into polysilicon through illuminating laser thereto.
Figure 2A:
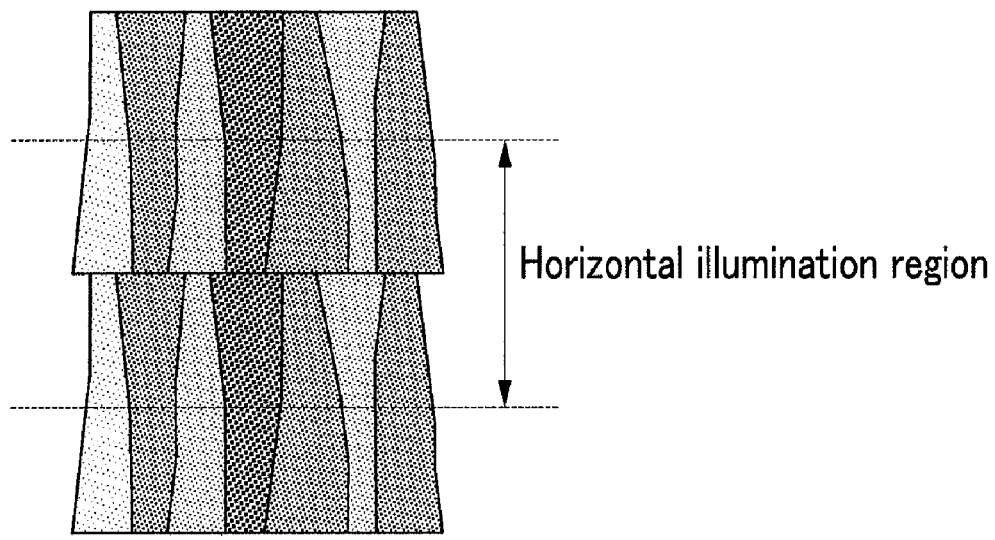
FIGS. 2A to 2C are micro-structures of polysilicon grains during crystallizing amorphous silicon into polysilicon through the sequential lateral crystallization process.
Figure 2B:
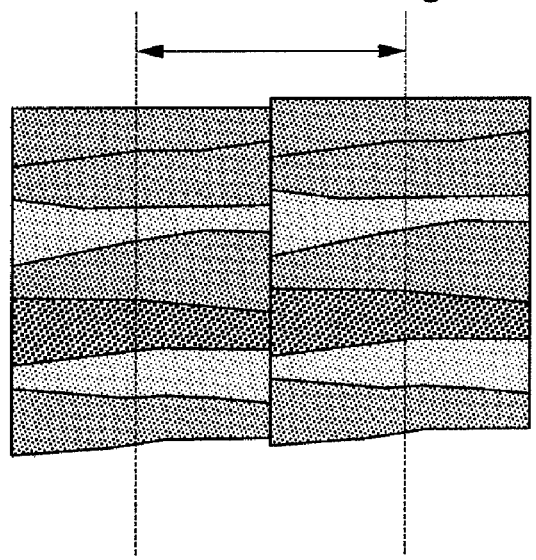
Figure 2C:
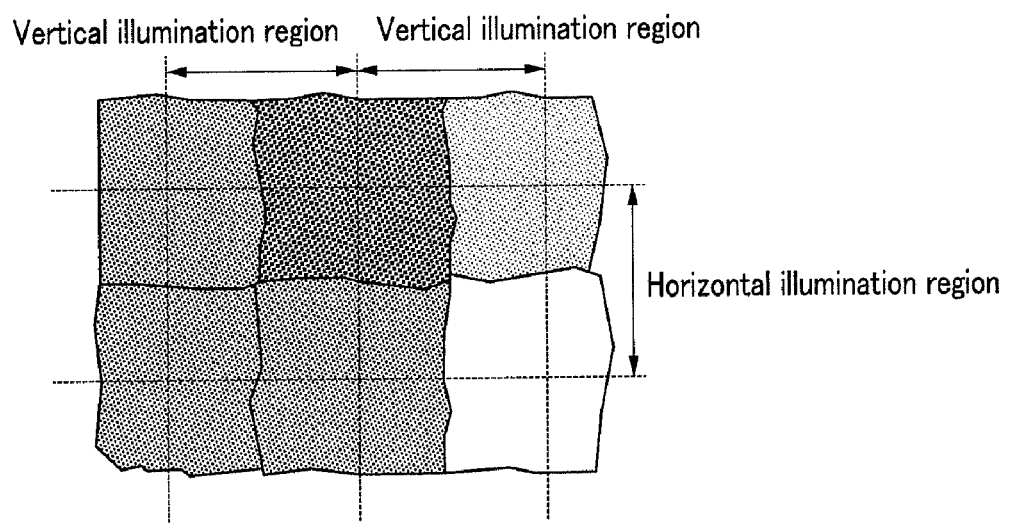

FIG. 1 is a sequential lateral crystallization process where amorphous silicon is crystallized into polysilicon, and FIGS. 2A to 2C are micro-structures of polysilicon grains during crystallizing the amorphous silicon into the polysilicon through the sequential lateral crystallization process.

Referring to FIG. 1, an amorphous silicon layer 200 is formed on an insulating substrate, and laser beams are illuminated onto an amorphous silicon layer 200 using a mask 300 having a transparent region 310. The amorphous silicon layer 200 corresponding to the transparent region 310 of the mask 300 is completely melted while forming a liquid phase region 210 at the amorphous silicon layer 200. A non-transparent region of the amorphous silicon layer 200 exists as a solid phase region 220. At this time, polysilicon grains are grown substantially perpendicular to an interface between the laser-illuminated liquid phase region 210 and the non-illuminated solid phase region 220. The growth of polysilicon grain stops at substantially the center of the liquid phase region 210. When the laser beams are illuminated onto the amorphous silicon layer 200 while moving the mask 300 in the growing direction of the polysilicon grains, the lateral growth of polysilicon grains continuously proceeds so that the desired particle sizes can be obtained.

FIG. 2A is a structure of polysilicon grains when the sequential lateral crystallization process is performed using a mask having a slit pattern proceeding in the horizontal direction. As shown in FIG. 2A, the polysilicon grains are grown perpendicular to the slit pattern while proceeding along the vertical direction.

FIG. 2B is a structure of polysilicon grains when the sequential lateral crystallization process is performed using a mask having a slit pattern proceeding along the vertical direction. As shown in FIG. 2B, the polysilicon grains are grown perpendicular to the slit pattern while proceeding along the horizontal direction.

According to an embodiment of the present invention, a sequential lateral crystallization process is performed using a mask having slit patterns in the horizontal and vertical directions. Then, polysilicon grains are grown to be isotropic with respect to the horizontal and vertical directions as shown in FIG. 2C. The polysilicon grains are one-directionally grown using the one-directional slit pattern, and then other-directionally grown using the other-directional slit pattern. In this case, the polysilicon grains one-directionally grown through first laser illumination become seeds, and the seeds are grown through second laser illumination perpendicular to the first growing direction. Accordingly, as shown in FIG. 2C, the resulting polysilicon grains are grown in the horizontal and vertical directions. That is, to isotropically grow the polysilicon grains in the horizontal and vertical directions, the sequential lateral crystallization process is performed using a mask having slit patterns along the horizontal and vertical directions. During the crystallization process, the mask should be aligned to overlap edge portions to prevent misalignment while moving the mask.

Figure 3A:
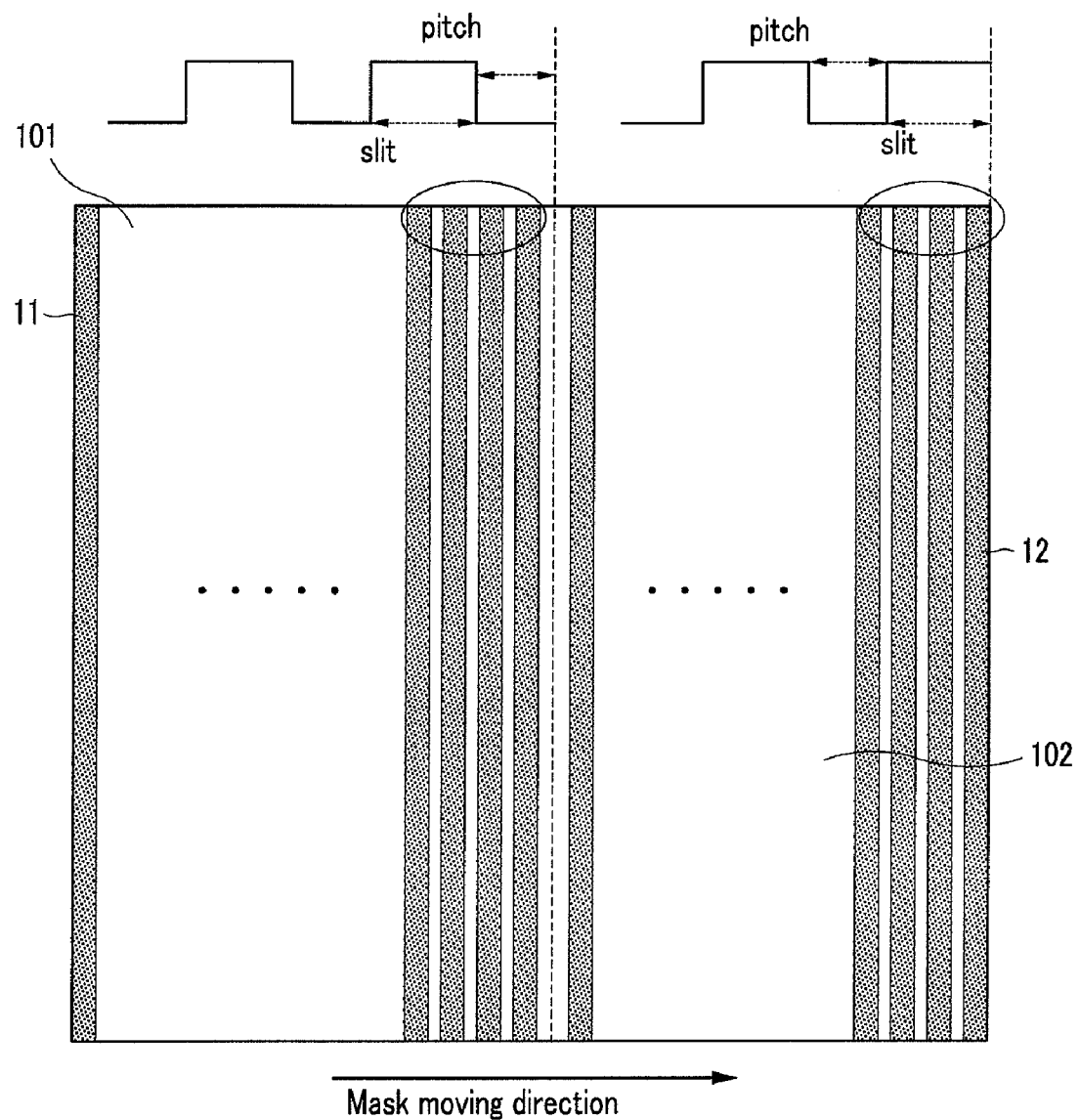
FIG. 3A is a plan view illustrating the structure of a mask for crystallizing amorphous silicon into polysilicon according to an embodiment of the present invention.
Figure 3B:
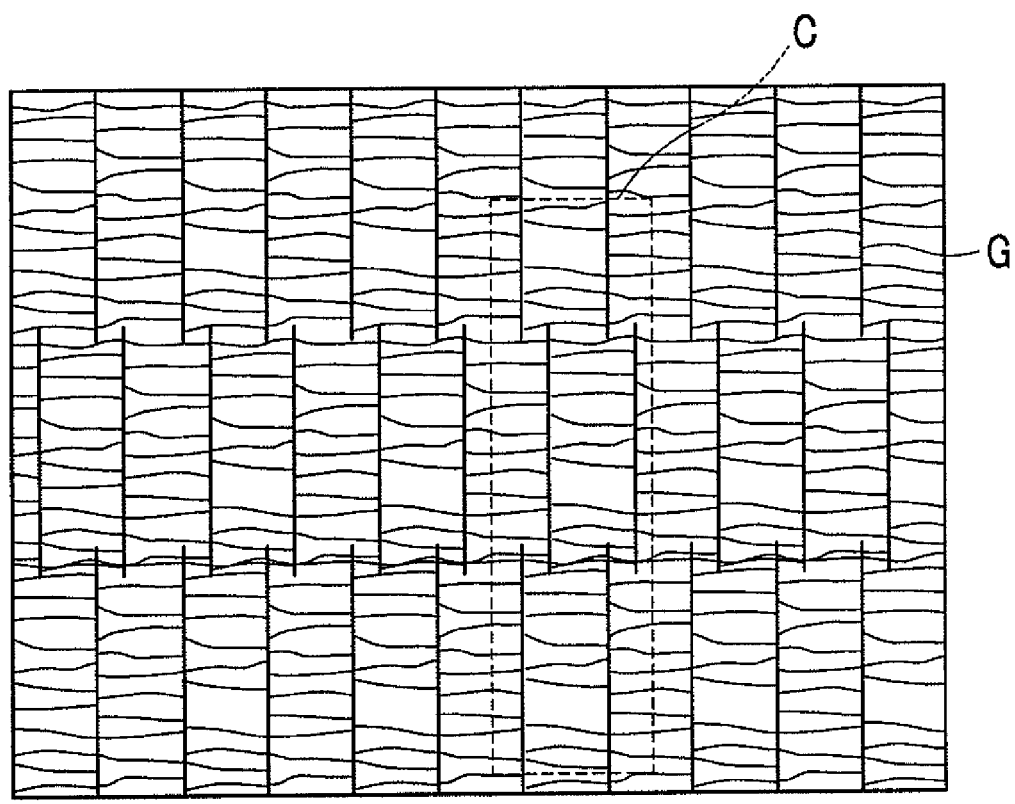
FIG. 3B is a micro-structure of polysilicon grains crystallized by using the mask of FIG. 3A.

FIG. 3A is a plan view of a mask for crystallizing amorphous silicon into polysilicon according to an embodiment of the present invention. FIG. 3B is a micro-structure of polysilicon grains crystallized by using the mask of FIG. 3A.

Referring to FIG. 3A, the mask includes a first vertical slit region 101 having a plurality of first slit patterns 11 in a vertical direction and a second vertical slit region 102 having a plurality of second slit patterns 12 in a vertical direction. Each of the plurality of first and second slit patterns 11 and 12 is spaced apart from each other with substantially the same distance (called "pitch") at each of the first vertical slit region 101 and the second vertical slit region 102. Each of the plurality of first slit patterns 11 is deviated from each of the plurality of second slit patterns 12 by one pitch.

The sequential lateral crystallization process is performed through illuminating laser beams onto a target area while moving the mask for growing polysilicon grains. According to an embodiment of the present invention, the mask moves horizontally but in a perpendicular direction from the plurality of first and second slit patterns 11 and 12. Consequently, the polysilicon grains are grown from the interface between the laser illuminated region which is a liquid region and the laser non-illuminated region which is a solid region. The growing direction of the polysilicon grains is perpendicular to the interface between the laser illuminated region and the laser non-illuminated region and is perpendicular to the direction of the plurality of slit patterns 11 and 12 as shown in FIG. 3B. Furthermore, boundaries G of the polysilicon grains are in a vertical direction. That is, if the plurality of first and second slit patterns 11 and 12 are formed in a direction perpendicular to the mask moving direction, the boundaries G of the polysilicon grains are also formed in a perpendicular direction from the mask moving direction. Therefore, when the mask moves for in subsequent steps, the boundaries G of the polysilicon grains formed at the different steps are deviated from each other, but uniformly spaced apart from each other and with the same distance. Accordingly, even though channel regions C of thin film transistors are formed at any location, the channel regions C have substantially the same number of the polysilicon grains' boundaries, thereby fabricating thin film transistors having uniform characteristics. Furthermore, as the plurality of first and second slit patterns 11 and 12 are formed in a vertical direction, the edge area of the first and second slit patterns 11 and 12 can be minimized, thereby uniformly crystallizing the polysilicon. Preferably, the mask of the present invention includes the first vertical slit region 101 and the second vertical slit region 102, but are not limited to these regions and may include a further plurality of slit regions.

Figure 4A:
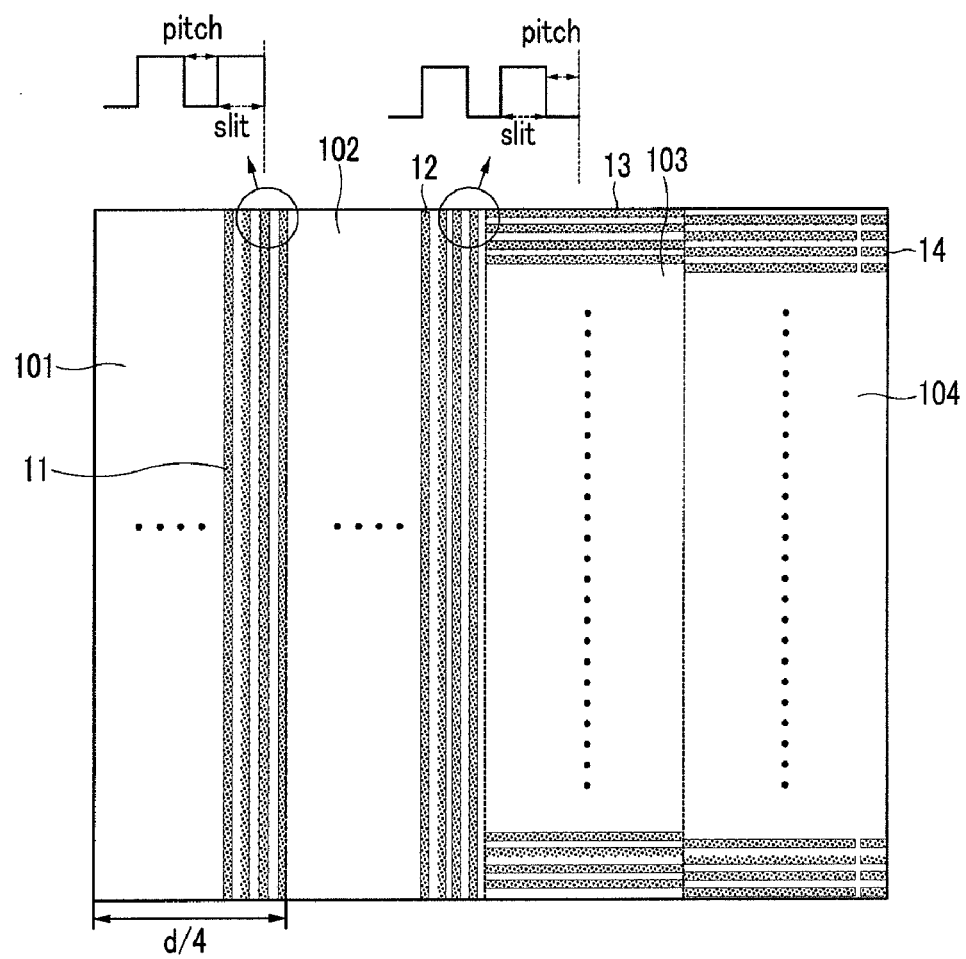
FIG. 4A is a plan view illustrating the structure of a mask for crystallizing amorphous silicon into polysilicon according to another embodiment of the present invention.
Figure 4B:
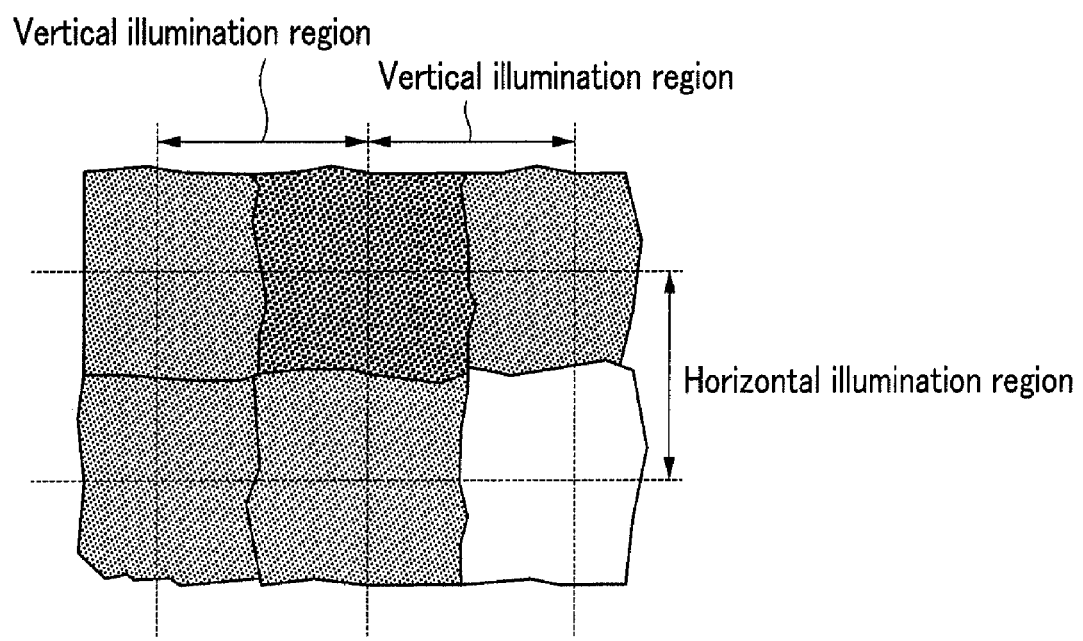
FIG. 4B is a micro-structure of polysilicon grains crystallized by using the mask of FIG. 4A.

FIG. 4A is a plan view of a mask for crystallizing amorphous silicon into polysilicon according to another embodiment of the present invention. FIG. 4B is a micro-structure of polysilicon grains crystallized by using the mask of FIG. 4A.

Referring to FIG. 4A, the mask includes first and second vertical slit regions 101 and 102 where a plurality of first slit patterns 11 and a plurality of second slit patterns 12 are respectively arranged in a horizontal direction, and first and second horizontal slit regions 103 and 104 where a plurality of third slit patterns 13 and a plurality of fourth slit patterns 14 are respectively arranged in a vertical direction. The plurality of first slit patterns 11 of the first vertical slit region 101 and the plurality of second slit patterns 12 of the second vertical slit region 102 are deviated from each other by one pitch therebetween. The plurality of third slit patterns 13 and the plurality of fourth slit patterns 14 are also deviated from each other by one pitch therebetween.

The sequential lateral crystallization process is performed through illuminating laser beams onto a target area while moving the mask by the distance of d/4 when the width of the mask is d. According to an embodiment of the present invention, the polysilicon grains are grown twice in the horizontal direction due to the deviation between the plurality of first slit patterns 11 and the plurality of second slit patterns 12. Furthermore, the polysilicon grains are grown twice in the vertical direction due to the deviation between the plurality of third slit patterns 13 and the plurality of fourth slit patterns 14. In this way, the polysilicon grains are grown to be isotropic with respect to the horizontal and vertical directions as shown in FIG. 4B. Accordingly, the thin film transistor using the resulting polysilicon can have isotropic current mobility in vertical and horizontal directions. As a result, when the thin film transistors are formed on a liquid crystal display panel, characteristics of the thin film transistors such as current mobility can be uniformly obtained even if they are arranged in various directions.

Alternatively, it is possible that the respective slit patterns are deviated from each other while dividing the horizontal and vertical slit regions into n-numbered multi-regions.

Figure 5:
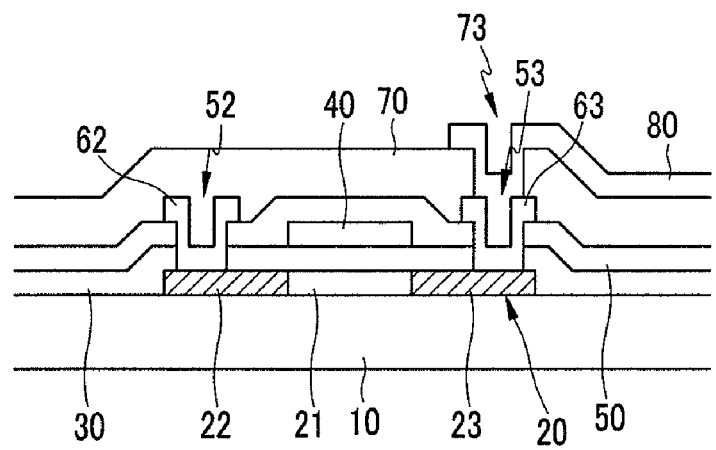
FIG. 5 is a cross sectional view of a polysilicon thin film transistor fabricated by using the mask of FIG. 3A or 4A.

FIG. 5 is a cross sectional view of a polysilicon thin film transistor according to a preferred embodiment of the present invention. Referring to FIG. 5, a semiconductor layer 20 is formed on an insulating substrate 10. Preferably, the semiconductor layer 20 is formed of polysilicon. The semiconductor layer 20 includes source and drain regions 22 and 23 while interposing a channel region 21. The source and the drain regions 22 and 23 are doped with n-type or p-type impurities. The source and the drain regions 22 and 23 can include a silicide layer. A gate insulating layer 30 is formed on the substrate 10 having the semiconductor layer 20. Preferably, the gate insulating layer 30 is formed of silicon oxide $SiO_2$, silicon nitride $SiN_x$, or the like. A gate electrode 40 is formed on the gate insulating layer 30 over the channel region 21. An inter-layered insulating layer 50 is formed on the gate insulating layer 30 while covering the gate electrode 40. The gate insulating layer 30 and the inter-layered insulating layer 50 have contact holes 52 and 53 exposing the source and the drain regions 22 and 23 of the semiconductor layer 20. A source electrode 62 is formed on the inter-layered insulating layer 50 such that it is connected to the source region 22 through the contact hole 52. A drain electrode 63 is also formed on the inter-layered insulating layer 50 such that it is connected to the drain region 23 through the contact hole 53 while facing the source electrode 62 around the gate electrode 40. A passivation layer 70 covers the inter-layered insulating layer 50 with a contact hole 73 exposing the drain electrode 63. A pixel electrode 80 is formed on the passivation layer 70. Preferably, the pixel electrode 80 is formed of transparent conductive material such as indium tin oxide (ITO) and indium zinc oxide (IZO), or reflective conductive material. The pixel electrode 80 is connected to the drain electrode 63 through the contact hole 73.

FIGS. 6A to 6E illustrate sequential steps of fabricating the polysilicon thin film transistor shown in FIG. 5. This method is also applicable for fabricating a semiconductor device.

Figure 6A:
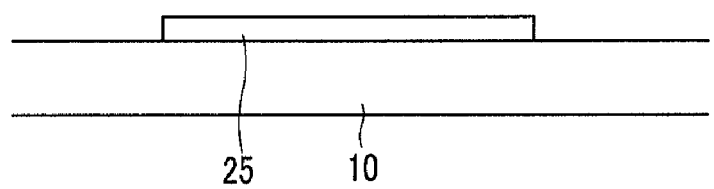
FIGS. 6A to 6E are the steps of fabricating the polysilicon thin film transistor shown in FIG. 5.

Referring to FIG. 6A, an amorphous silicon thin film 25 is formed on an insulating substrate 10 through depositing amorphous silicon onto the substrate 10 using techniques such as low pressure chemical vapor deposition, plasma chemical vapor deposition, or sputtering, and then patterning.

Figure 6B:
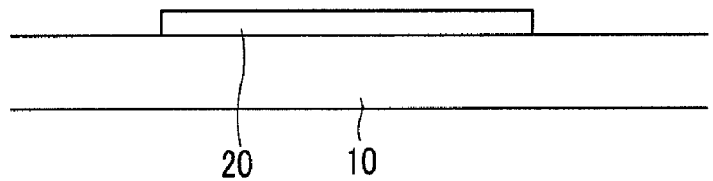
Figure 6C:
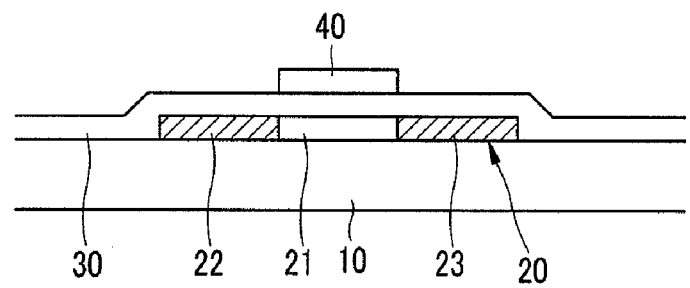

Referring to FIG. 6B, laser beams are illuminated onto the amorphous silicon thin film 25 (in FIG. 6A) using a mask described in FIG. 3A or 4A, to thereby form a polysilicon semiconductor layer 20. In this step, a sequential lateral crystallization process is performed as described above. Thereafter, as shown in FIG. 6C, a gate insulating layer 30 is formed on the semiconductor layer 20 through depositing silicon oxide or silicon nitride onto the substrate 10. Subsequently, conductive material is deposited onto the gate insulating layer 30, and patterned to thereby form a gate electrode 40.

Then, n-type or p-type impurities are ion-implanted into the semiconductor layer 20 using the gate electrode 40 as a mask, and thereby to form source and drain regions 22 and 23. And a channel region 21 is also formed between the source and the drain regions 22 and 23.

Figure 6D:
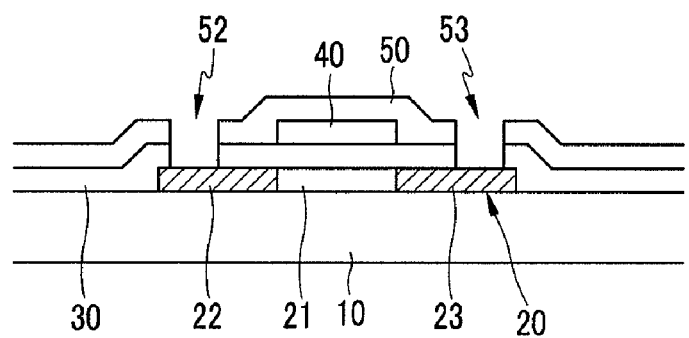

Referring to FIG. 6D, an inter-layered insulating layer 50 is formed on the gate insulating layer 30 such that it covers the gate electrode 40, and patterned together with the gate insulating layer 30 to thereby form contact holes 52 and 53, exposing the source and the drain regions 22 and 23 of the semiconductor layer 20.

Figure 6E:
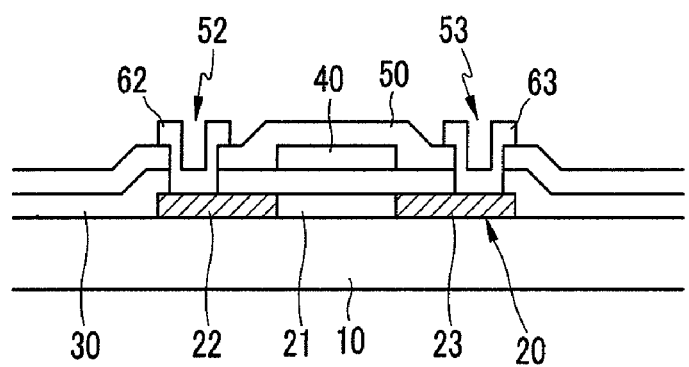

Referring to FIG. 6E, a data line assembly metallic layer is deposited onto the insulating substrate 10 having the contact holes 52 and 53, and patterned to thereby form source and drain electrodes 62 and 63. The source and the drain electrodes 62 and 63 are connected to the source and the drain regions 22 and 23 through the contact holes 52 and 53, respectively.

Finally, as shown in FIG. 5, a passivation layer 70 is deposited onto the substrate 10 having the source and the drain electrodes 62 and 63, and patterned to thereby form a contact hole exposing the drain electrode 63. A pixel electrode 80 is then formed on the passivation layer 70 through depositing transparent conductive material such as ITO and IZO or reflective conductive material onto the passivation layer 70, and then patterning.

As described above, amorphous silicon is crystallized into polysilicon using a mask having a slit pattern in the horizontal and vertical directions. Consequently, the polysilicon grains are grown to be isotropic with respect to the horizontal and vertical directions. As the resulting polysilicon thin film transistor has isotropic current mobility with respect to the horizontal and vertical directions, the characteristics of the thin film transistor can be uniformly obtained even if they are arranged in various directions.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method for crystallizing amorphous silicon into polysilicon, the method comprising the steps of:
   illuminating a laser beam at a first area of an amorphous silicon substrate through a first mask region including a plurality of first slit patterns, wherein each of the plurality of the first slit patterns is spaced apart by a first one pitch from another and is extending in the perpendicular direction to a mask moving direction;
   moving the mask by d/4 distance, wherein the 'd' is the length of the mask along the moving direction; and
   illuminating a laser beam at the first area of the amorphous silicon substrate through a second mask region including a plurality of second slit patterns, wherein each of the plurality of the second slit patterns is spaced apart by the first one pitch from another and is extending in the same direction as the first slit patterns, wherein the first slit patterns and the second slit patterns are deviated from each other by the first one pitch and the first one pitch is smaller than each widths of the first and the second slit patterns.

2. The method of claim 1, wherein the laser beam is illuminated at the amorphous silicon substrate through the second mask region, when the laser beam is illuminated at the first area of amorphous silicon substrate through the first mask region.

3. The method of claim 1, wherein the laser beam is illuminated at the amorphous silicon substrate through the first mask region, when the laser beam is illuminated at the first area of amorphous silicon substrate through the second mask region.

4. A method for crystallizing amorphous silicon into polysilicon, the method comprising the steps of:
   illuminating a laser beam at a first area of an amorphous silicon substrate through a first mask region including a plurality of first slit patterns, wherein each of the plurality of the first slit patterns is spaced apart by a first one pitch from another and is extending in the perpendicular direction to a mask moving direction;
   moving the mask by d/4 distance, wherein the 'd' is the length of the mask along the moving direction;
   illuminating a laser beam at the first area of the amorphous silicon substrate through a second mask region including a plurality of second slit patterns, wherein each of the plurality of the second slit patterns is spaced apart by the first one pitch from another and is extending in the same direction as the first slit patterns;
   moving the mask by d/4 distance, wherein the 'd' is the length of the mask along the moving direction;
   illuminating a laser beam at the first area of the amorphous silicon substrate through a third mask region including a plurality of third slit patterns, wherein each of the plurality of the third slit patterns is spaced apart by a second one pitch from another and is extending in the parallel direction to the mask moving direction;
   moving the mask by d/4 distance, wherein the 'd' is the length of the mask along the moving direction; and
   illuminating a laser beam at the first area of the amorphous silicon substrate through a fourth mask region including a plurality of fourth slit patterns, wherein each of the plurality of the fourth slit patterns is spaced apart by the second one pitch from another and is extending in the same direction as the third slit patterns;
   wherein the first slit patterns and the second slit patterns are deviated from each other by the first one pitch and the third slit patterns and the fourth slit patterns are deviated from each other by the second one pitch,
   wherein the first, second, third and fourth regions are defined on the mask along the mask moving direction.

5. A method for crystallizing amorphous silicon into polysilicon, the method comprising the steps of:
   illuminating a laser beam at a first area of an amorphous silicon substrate through a first mask region including a plurality of first slit patterns, wherein each of the plurality of the first slit patterns is spaced apart by a first one pitch from another and is extending in the parallel direction to a mask moving direction;
   moving the mask by d/4 distance, wherein the 'd' is the length of the mask along the moving direction;
   illuminating a laser beam at a first area of the amorphous silicon substrate through a second mask region including a plurality of second slit patterns, wherein each of the plurality of the second slit patterns is spaced apart by the first one pitch from another and is extending in the same direction as the first slit patterns;
   moving the mask by d/4 distance, wherein the 'd' is the length of the mask along the moving direction;

illuminating a laser beam at a third area of the amorphous silicon substrate through a third mask region including a plurality of third slit patterns, wherein each of the plurality of the third slit patterns is spaced apart by a second one pitch from another and is extending in the perpendicular direction to the mask moving direction;

moving the mask by d/4 distance, wherein the 'd' is the length of the mask along the moving direction; and illuminating a laser beam at the first area of the amorphous silicon substrate through a fourth mask region including a plurality of fourth slit patterns, wherein each of the plurality of the fourth slit patterns is spaced apart by the second one pitch from another and is extending in the same direction as the third slit patterns;

wherein the first slit patterns and the second slit patterns are deviated from each other by the first one pitch and the third slit patterns and the fourth slit patterns are deviated from each other by the second one pitch, wherein the first, second, third and fourth regions are defined on the mask along the mask moving direction.

* * * * *